US009319011B2

(12) United States Patent
Kinyua et al.

(10) Patent No.: US 9,319,011 B2
(45) Date of Patent: Apr. 19, 2016

(54) CLASS-D AMPLIFIER HAVING MIXED SIGNAL FEEDBACK CONTROL

(71) Applicant: TAIWAN SEMICONDUCTOR MANUFACTURING COMPANY, LTD., Hsinchu (TW)

(72) Inventors: Martin Kinyua, Cedar Park, TX (US); Eric Soenen, Austin, TX (US)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 12 days.

(21) Appl. No.: 14/300,803

(22) Filed: Jun. 10, 2014

(65) Prior Publication Data
US 2015/0303885 A1    Oct. 22, 2015

Related U.S. Application Data

(60) Provisional application No. 61/982,074, filed on Apr. 21, 2014.

(51) Int. Cl.
*H03F 3/38* (2006.01)
*H03F 3/217* (2006.01)
*H03F 3/183* (2006.01)
(Continued)

(52) U.S. Cl.
CPC ............. *H03F 3/2178* (2013.01); *H03F 3/183* (2013.01); *H03M 1/12* (2013.01); *H03M 3/458* (2013.01); *H03F 2200/03* (2013.01); *H03F 2200/135* (2013.01); *H03F 2200/165* (2013.01)

(58) Field of Classification Search
CPC .................................. H03F 3/38; H03F 3/217

USPC ......................................... 330/10, 207 A, 251
See application file for complete search history.

(56) References Cited

U.S. PATENT DOCUMENTS

| 6,373,334 B1 * | 4/2002 | Melanson ............. H03F 3/2175 330/10 |
| 7,990,215 B2 | 8/2011 | Soenen et al. |
| 2013/0272545 A1 | 10/2013 | Kinyua et al. |

FOREIGN PATENT DOCUMENTS

| JP | 2008521269 | 6/2008 |
| KR | 10-0716527 | 5/2007 |
| WO | 2006/054214 | 5/2006 |

OTHER PUBLICATIONS

Samala, Sreekiran et al., "45Nm CMOS 8 Class-D Audio Driver with 79% Efficiency and 100dB SNR", ISSCC 2010 / Session 4 / Analog Techniques / 4.7, pp. 86-88.
(Continued)

*Primary Examiner* — Steven J Mottola
(74) *Attorney, Agent, or Firm* — Hauptman Ham, LLP

(57) ABSTRACT

A Class-D amplifier includes an analog-to-digital converter (ADC), a digital filter, a digital pulse width modulation (PWM) unit, a pre-driver unit, and an output driver. The ADC is configured to receive an input signal and one or more feedback signals, and to generate a first digital signal. The digital filter, the digital PWM unit, and the pre-driver unit are configured to generate control signals based on the first digital signal. The output driver is configured to generate an output signal based on the control signals. A first feedback path is defined as from a first output node of the output driver to a first input node of the ADC; and a second feedback path is defined as from a second output node of the output driver to a second input node of the ADC. The first and second feedback paths are free from a low-pass filtering device.

20 Claims, 5 Drawing Sheets

(51) Int. Cl.
*H03M 1/12* (2006.01)
*H03M 3/00* (2006.01)

(56) References Cited

OTHER PUBLICATIONS

Ramaswamy, Srinath et al., "A High-Performance Digital-Input Class-D Amplifier with Direct Battery Connection in a 90nm Digital CMOS Process", ISSCC 2008 / Session 24 / Analog Power Techniques / 24.2, pp. 436-438.
Foreji, Brett, et al., "A 700+−mW Class D Design With Direct Battery Hookup in a 90-nm Process", IEEE Journal of Solid-State Circuits, vol. 40, No. 9, Sep. 2005, pp. 1880-1887.
Office Action dated Oct. 29, 2015 and English translation from corresponding No. KR 10-2014-0160846.
Notice of Allowance dated Jan. 28, 2016 and English translation from corresponding No. JP 10-2014-0160846.

* cited by examiner

CLASS-D AMPLIFIER HAVING MIXED SIGNAL FEEDBACK CONTROL

BACKGROUND

Amplifiers are classified based on certain operating characteristics. Class-D amplifiers, in contrast to Class-A, Class-B, or Class-AB amplifiers, use the switching modes of transistors to regulate power delivery. Class-D amplifiers are preferred for many applications because the full "on" or full "off" characteristic of the gating signals ensures that the driver portion of the circuit is very power efficient. A Class-D amplifier is often used as a low frequency amplifier due to the high efficiency and low heat dissipation characteristics. An example low frequency amplifier application is an audio amplifier.

In some applications, analog-input Class-D amplifiers are used; however, they require high precision analog components and generally require complicated analog control. However, analog components that are required in some analog-input Class-D amplifier applications, such as the analog integrators and the ramp generators therein, are difficult to be reliably fabricated with sufficient precision in some present day semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
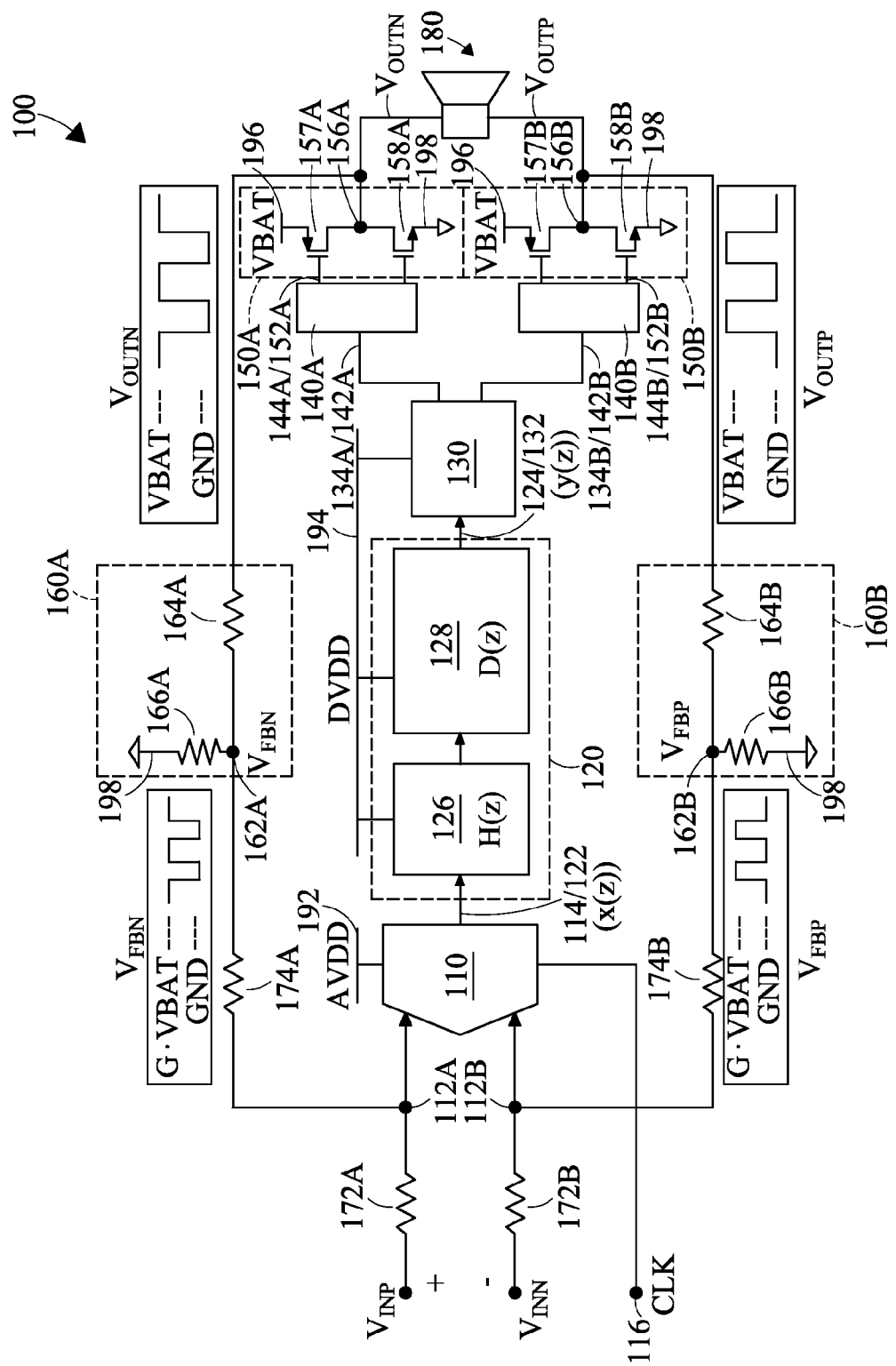
FIG. 1 is a circuit diagram of a Class-D amplifier in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a Class-D amplifier has an analog-to-digital converter (ADC) that allows the signal processing operations of the Class-D amplifier to be performed in the digital domain. In at least some embodiments, the signal processing operations are primarily performed in the digital domain. The Class-D amplifier has a feedback path free from a low-pass filtering device that has a cutoff frequency lower than a sampling frequency of the ADC. Also, in some embodiments, the ADC is a continuous-time ADC. As such, in at least some embodiments the need for precise analog circuits in Class-D amplifier is reduced or eliminated.

FIG. 1 is a circuit diagram of a Class-D amplifier 100 in accordance with some embodiments. Class-D amplifier 100 includes an analog-to-digital converter (ADC) 110, a digital filter 120 coupled to ADC 110, a digital pulse width modulation (PWM) unit 130 coupled to digital filter 120, a first pre-driver unit 140A and a second pre-driver unit 140B coupled to digital PWM unit 130, a first Class-D output driver 150A coupled to pre-driver unit 140A, and a second Class-D output driver 150B coupled to pre-driver unit 140B. Class-D amplifier 100 further includes a first feedback unit 160A coupled between ADC 110 and Class-D output driver 150A, a second feedback unit 160B coupled between ADC 110 and Class-D output driver 150B, a coupling resistive device 172A coupled to ADC 110 for receiving a non-inverted analog signal $V_{INP}$, a coupling resistive device 172B coupled to ADC 110 for receiving an inverted analog signal $V_{INN}$, a coupling resistive device 174A between ADC 110 and feedback unit 160A, and a coupling resistive device 174B between ADC 110 and feedback unit 160B. The outputs of Class-D output driver 150A and Class-D output driver 150B are usable to drive a load 180, which is not part of Class-D amplifier 100.

ADC 110 has a non-inverted input node 112A, an inverted input node 112B, and a digital output port 114. ADC 110 receives a non-inverted analog input signal $V_{INP}$ at non-inverted input node 112A through coupling resistive device 172A; and ADC 110 receives an inverted analog input signal $V_{INN}$ at inverted input node 112B through coupling resistive device 172B. Also, ADC 110 receives an inverted feedback signal $V_{FBN}$ at non-inverted input node 112A through coupling resistive device 174A; and ADC 110 receives a non-inverted feedback signal $V_{FBP}$ at inverted input node 112B through coupling resistive device 174B. Feedback signals $V_{FBP}$ and $V_{FBN}$ are generated by feedback units 160A and 160B. ADC 110 generates a first digital signal (represented by a z-domain expression x(z)) at digital output port 114 based on signals $V_{INP}$, $V_{INN}$, $V_{FBP}$, and $V_{FBN}$. Digital output port 114 is an N-bit port, where N is a positive integer. Therefore, the first digital signal x(z) refers to a signal on a single node of port 114 when N equals one, or a collective of signals on N nodes of port 114 when N equals two or greater.

ADC 110 further includes a clock node 116 configured to receive a clock signal CLK. Clock signal CLK is usable as a sampling clock for ADC 110 and has a sampling frequency $f_S$. In some embodiments, input analog signals $V_{INP}$ and $V_{INN}$ have a signal bandwidth ranging from a zero frequency to a predetermined frequency $f_{BW}$, and the sampling frequency $f_S$ is not less than a predetermined multiple of the predetermined frequency $f_{BW}$. In some embodiments, the predetermined multiple is at least 2. In some embodiments, the predetermined multiple is 64, 128, or 256. In some embodiments, Class-D amplifier 100 is usable for processing human-audible audio signals. As such, the predetermined frequency $f_{BW}$ ranges from 8 kHz to 20 kHz.

In some embodiments, ADC 110 is a continuous-time ADC. In some embodiments, ADC 110 is a continuous-time delta-sigma ADC. In some embodiments, ADC 110 is a discrete-time ADC.

In some embodiments in which ADC 110 is a discrete-time ADC, an additional anti-alias filter is disposed preceding ADC 110. In some embodiments, a continuous-time ADC has inherent anti-aliasing characteristics, and Class-D amplifier 100 implemented with the continuous-time ADC is suitable to be implemented without an additional anti-alias filter. Also, compared with a discrete-time ADC having a switched-capacitor implementation, using a continuous-time ADC further eliminates the noise-folding issue associated with the switched-capacitor implementation.

In a discrete-time ADC having a switched-capacitor implementation, the sampling clock frequency is limited by the operational amplifier settling requirements and to about 20% of the unity-gain frequency of the operational amplifiers. In some embodiments in a continuous-time ADC, the sampling clock frequency of a continuous-time ADC is limited by the regeneration time of the quantizer and the update rate of a feedback digital-to-analog converter (DAC) therein. Therefore, in some applications, a continuous-time ADC is suitable to operate with a higher sampling clock frequency (which is about 2-4 times greater) and thus achieve a greater signal bandwidth than a discrete-time ADC having a switched-capacitor implementation.

Figure 4:
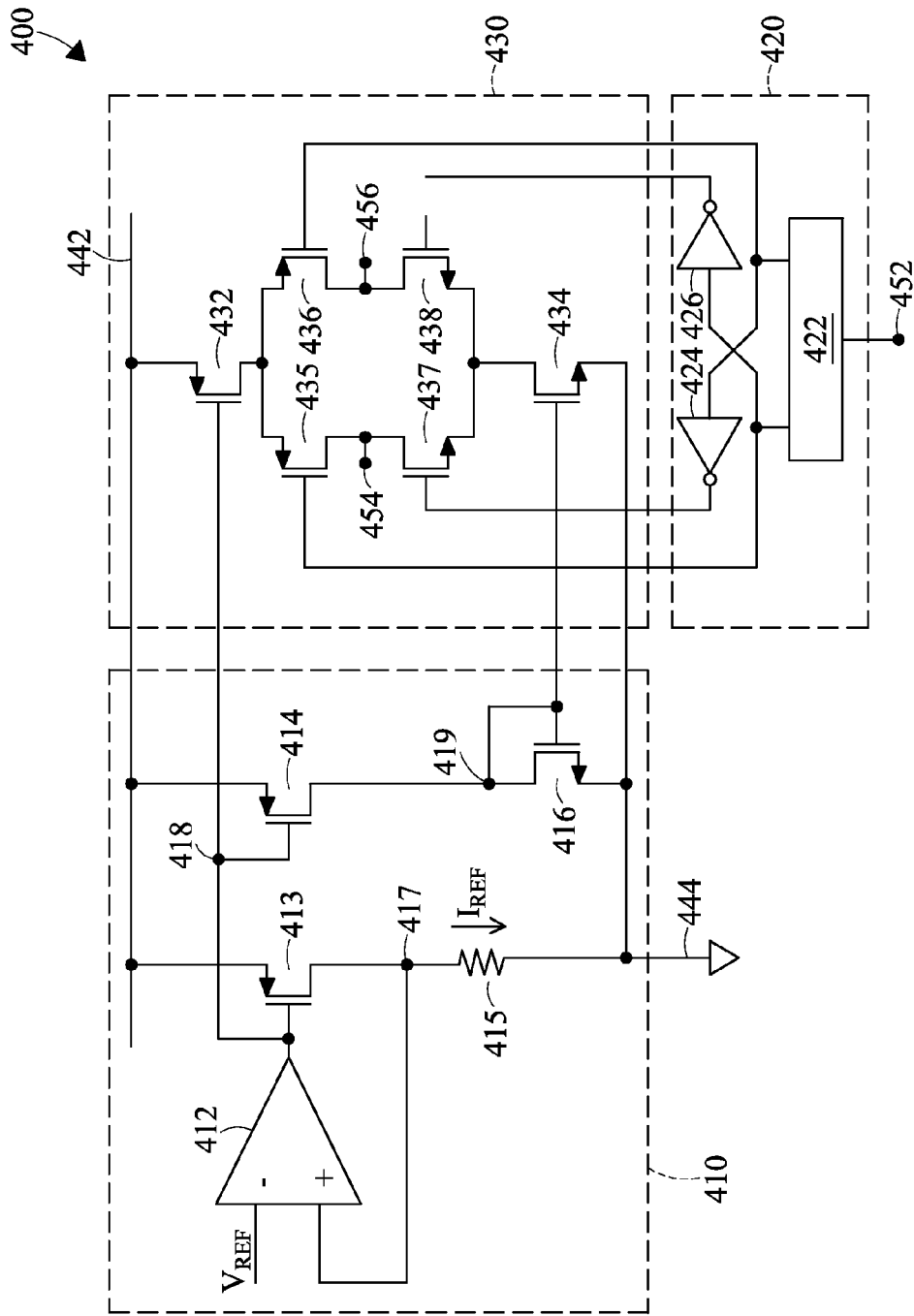
FIG. 4 is a circuit diagram of a digital-to-analog converter (DAC) usable in a continuous-time delta-sigma ADC in accordance with some embodiments.

Class-D amplifier 100 further includes an analog power supply node 192 and an analog reference node (e.g., node 444 in FIG. 4). Analog power supply node 192 is configured to have an analog supply voltage level AVDD, and the analog reference node is configured to have an analog reference ground level. Analog power supply node 192 and the analog reference node define an analog power domain. ADC 110 is electrically coupled between analog power supply node 192 and the analog reference node and powered by the analog power domain.

Digital filter 120 includes an input port 122 and an output port 124. In some embodiments, input port 122 and output port 124 are also N-bit ports. Input port 122 is electrically coupled to output port 114 of ADC 110. Digital filter 120 is configured to generate a second digital signal (represented by a z-domain expression y(z)) at output port 124 based on first digital signal x(z). Digital filter 120 includes a loop filter 126 followed by a compensation filter 128. Loop filter 126 has a transfer function represented by a z-domain expression H(z) and is configured to have a high gain within a predetermined frequency band, such as from the zero frequency to the predetermined frequency $f_{BW}$, and to move truncation errors of ADC 110 and other errors out of the predetermined frequency band. Compensation filter 128 has a transfer function represented by a z-domain expression D(z) and is configured to increase stability of an overall transfer function of the Class-D amplifier 100.

In some embodiments, the transfer function H(z) of loop filter 126 is first determined based on a design requirement regarding a magnitude or gain aspect of the transfer function of Class-D amplifier 100. Subsequently, the transfer function D(z) of compensation filter 128 is determined in order to introduce one or more poles or zeros to stabilize the transfer function of the Class-D amplifier 100. In some embodiments, loop filter 126 and compensation filter 128 refer to two separable circuit units in Class-D amplifier 100. In some embodiments, loop filter 126 and compensation filter 128 are conceptual units referring to the result of two designing steps, but are still implemented by an integrated circuit unit. In some embodiments, loop filter 126 and compensation filter 128 refer to a digital signal processing (DSP) unit executing a set of DSP instructions.

Digital PWM unit 130 has an input port 132, a first output node 134A, and a second output node 134B. Input port 132 of digital PWM unit 130 is coupled to output port 124 of digital filter 120 and is configured to receive the second digital signal y(z). Digital PWM unit 130 is further configured to generate a first PWM signal at output node 134A and a second PWM signal at output node 134B based on the second digital signal y(z). In some embodiments, the first PWM signal and the second PWM signal are logically complementary to each other. In some embodiments, only one of the first PWM signal and the second PWM signal is generated, and thus the corresponding output node 134A or 134B is omitted.

Class-D amplifier 100 further includes a digital power supply node 194 and a digital reference node (not shown). Digital power supply node 194 is configured to have a digital supply voltage level DVDD, and the digital reference node is configured to have a digital reference ground level. Digital power supply node 194 and the digital reference node define a digital power domain. Digital filter 120 and digital PWM unit 130 are electrically coupled between digital power supply node 194 and the digital reference node and powered by the digital power domain.

Class-D amplifier 100 also includes an interface power supply node 196 and an interface reference node 198. Interface power supply node 196 is configured to have an interface supply voltage level VBAT, and the interface reference node is configured to have an interface reference ground level GND. Interface power supply node 196 and the interface reference node 198 define an interface power domain. In some embodiments, interface supply voltage level VBAT is substantially a battery voltage level in class-D amplifier 100.

In some embodiments, the analog reference node, the digital reference node, and interface reference node 198 are configured to carry substantially the same voltage level. In some embodiments, the analog reference node, the digital reference node, and interface reference node 198 are electrically coupled with one another by one or more electrostatic discharge (ESD) protection circuits.

Pre-driver unit 140A has an input node 142A, a first output node 144A, and a second output node 146A. Input node 142A is coupled to PWM output node 134A. Pre-driver unit 140A is configured to generate a set of control signals at output nodes 144A and 146A based on the PWM signal from digital PWM unit 130 through input node 142A.

Class-D output driver 150A includes a first input node 152A, a second input node 154A, and an output node 156A. Input node 152A is coupled to output node 144A, and input node 154A is coupled to output node 146A. Class-D output driver 150A is configured to generate a first output signal $V_{OUTN}$ at output node 156A based on the set of control signals on input nodes 152A and 154A.

Class-D output driver 150A further includes a P-type transistor 157A and an N-type transistor 157B. P-type transistor 157A has a source coupled to power supply node 196, a drain coupled to output node 156A, and a gate coupled to input node 152A. N-type transistor 158A has a source coupled to reference node 198, a drain coupled to output node 156A, and a gate coupled to input node 154A. In some embodiments, the set of control signals at output nodes 144A and 146A are configured to turn on one of transistors 157A and 158A according to the PWM signal at node 142A. Therefore, output signal $V_{OUTN}$ is also a PWM signal switching between a high voltage level equal to interface supply voltage level VBAT and a low voltage level equal to interface reference ground level GND. In some embodiments, the set of control signals at output nodes 144A and 146A are generated in a manner that transistors 157A and 158A are not turned on at the same time.

Pre-driver unit 140B and Class-D output driver 150B are arranged and operated in a manner similar to pre-driver unit 140A and Class-D output driver 150A. The components in pre-driver unit 140B and Class-D output driver 150B that are the same or similar to those in pre-driver unit 140A and Class-D output driver 150A are given the same reference numbers, except the notation "A" is replaced with the notation "B." Detailed description thereof is thus omitted. Moreover, Class-D output driver 150B is configured to generate a second output signal $V_{OUTP}$ at output node 156B based on the set of control signals on input nodes 152B and 154B. Therefore, output signal $V_{OUTP}$ is also a PWM signal switching between a high voltage level equal to interface supply voltage level VBAT and a low voltage level equal to interface reference ground level GND.

Output signals $V_{OUTP}$ and $V_{OUTN}$ are electrically coupled with load 180 and are usable to drive load 180. In some embodiments, load 180 includes a loudspeaker. In some embodiments, load 180 further includes a low-pass filter.

Feedback unit 160A includes a resistive network function as a voltage divider. Feedback unit 160A includes a feedback voltage node 162A, a first feedback resistive device 164A, and a second resistive device 166A. First feedback resistive device 164A is coupled between output node 156A and feedback voltage node 162A. Second feedback resistive device 166A is coupled between feedback voltage node 162A and interface reference node 198. Feedback unit 160A is configured to generate the inverted feedback signal $V_{FBN}$ based on output signal $V_{OUTN}$. In some embodiments, if resistive device 164A has a resistance value $R_1$, resistive device 166A has a resistance value $R_2$, a gain factor G is defined as:

$$G=R_2/(R_1+R_2).$$

Therefore, inverted feedback signal $V_{FBN}$ is a PWM signal switching between a high voltage level equal to G·VBAT and a low voltage level equal to interface reference ground level GND. In some embodiments, gain factor G is less than 1. In some embodiments, gain factor G ranges from 0.3 to 0.7. In some embodiments, gain factor G is 0.4.

Furthermore, a feedback path is defined as from output node 156A through feedback unit 160A and coupling resistive device 174A to input node 112A. In some embodiments, the feedback path is free from a low-pass filtering device that has a cutoff frequency lower than a sampling frequency $f_S$ of the ADC. In some embodiments, other than the parasitic capacitance comes with the electrical features in the feedback path, there is no more capacitive devices, such as metal-oxide semiconductor (MOS) capacitors, metal-insulator-metal (MIM) capacitors, or capacitors external to the integrated circuit chip that contains Class-D amplifier 100, electrically coupled with the feedback path.

As a result, within a frequency band no greater than the sampling frequency $f_S$, the feedback path only scales the output signal $V_{OUTN}$ to a voltage level acceptable to ADC 110 by a resistive network without any additional analog circuit analysis or any additional areas for energy-storing capable devices, such as capacitive devices or inductive devices. The signal processing operations would be primarily performed in the digital domain, and the need for precise analog circuits is reduced or eliminated. The loop characteristics of Class-D amplifier 100 is primarily determined by digital filter 120, where the gain, poles, and zeros are suitable to be implemented by first, second, or higher order loops in the digital domain without the limitations of analog circuits, such as vulnerability to process variations, noise, and limited achievable gain. In some embodiments, the in-band loop gain of Class-D amplifier 100 is suitable to be made arbitrarily made high (e.g., >60 dB) to effectively suppress noises attributable to ADC 110 and digital PWM unit 130 and output driver non-linearities, and attain sufficient Power Supply Rejection (PSR).

Feedback unit 160B and coupling resistive device 174B are arranged and operated in a manner similar to feedback unit 160A and coupling resistive device 174A. The components in feedback unit 160B that are the same or similar to those in feedback unit 160A are given the same reference numbers, except the notation "A" is replaced with the notation "B." Detailed description thereof is thus omitted.

Class-D amplifier 100 has a differential-mode configuration usable to process a pair of differential analog signals. Therefore, ADC 110 is configured to receive a pair of differential analog signals, such as non-inverted analog signal $V_{INP}$ and inverted analog signal $V_{INN}$, and output a pair of output signals $V_{OUTP}$ and $V_{OUTN}$. In some embodiments, Class-D amplifier 100 is modifiable to have a single-ended-mode configuration to process a single-ended analog signal. In such embodiments, ADC 110 is configured to receive a reference signal and an analog signal, such as one of the analog signals $V_{INP}$ and $V_{INN}$. Only one of the output signals $V_{OUTP}$ and $V_{OUTN}$ is generated, and the corresponding pre-driver unit 140A/140B, output driver 150A/150B, feedback unit 160A/160B, coupling resistive device 174A/174B, and/or coupling resistive device 172A/172B are omitted. As such, in some embodiments, load 180 is driven by the output signal and another reference signal.

Figure 2:
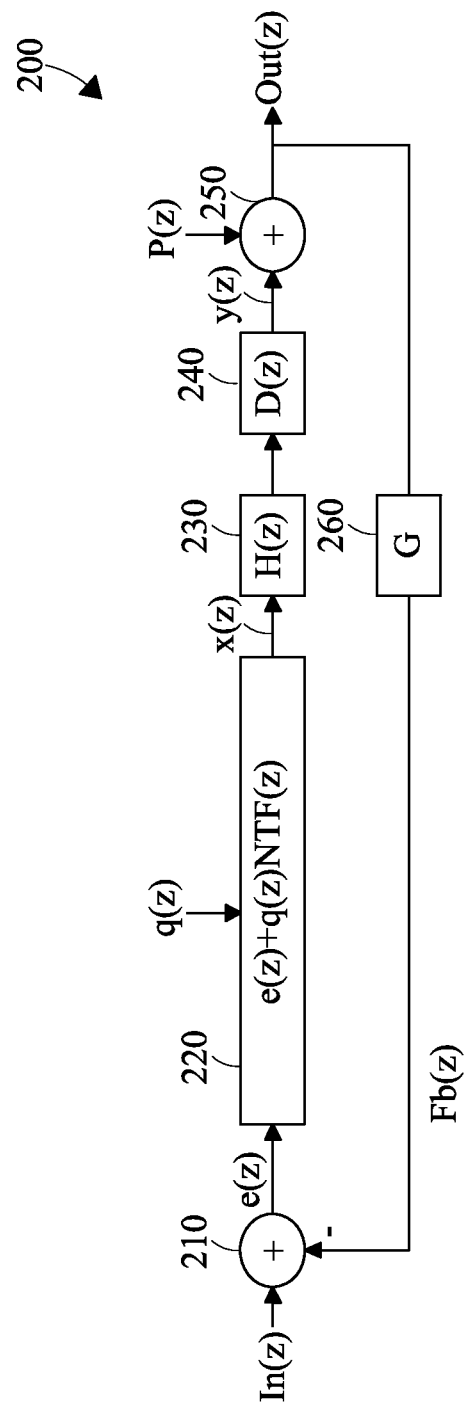
FIG. 2 is a Z-domain block diagram of a Class-D amplifier in accordance with some embodiments.

FIG. 2 is a Z-domain block diagram 200 of a Class-D amplifier in accordance with some embodiments. Z-domain block diagram 200 illustrates various signals and transfer functions of various components in a Class-D amplifier, such as Class-D amplifier 100.

Z-domain block diagram 200 includes a first summation node 210, an ADC transfer function block 220, a loop filter transfer function block 230, a compensation filter transfer function block 240, a second summation node 210, and a feedback block 260.

Summation node 210 combines an input signal, having a z-domain expression In(z), and an inverted version of a feedback signal, having a z-domain expression Fb(z), and generates an error signal, having a z-domain expression e(z), accordingly. Input signal In(z) corresponds to the Z-domain expression of input signals $V_{INP}$ and $V_{INN}$. ADC transfer function block 220 corresponds to the operation of ADC 110 in FIG. 1, which converts error signal e(z) into a digital signal x(z). ADC transfer function block 220 introduces a quantization error q(z), which is further processed by a noise transfer function NTF(z). In other words, digital signal x(z) meets the following equation:

$$x(z)=e(z)+q(z)\text{NTF}(z).$$

In some embodiments, NTF(z) meets the following equations:

$$\text{NTF}(z)=(1-z^{-1})^M, \text{ and } M \text{ is a positive integer.}$$

Loop filter transfer function block 230 corresponds to loop filter 126 and has a transfer function H(z). Compensation filter transfer function block 240 corresponds to compensation filter 128 and has a transfer function D(z). Loop filter transfer function block 230 and compensation filter transfer function block 240 convert digital signal x(z) into digital y(z), which meets the following equation:

$$y(z)=x(z)H(z)D(z).$$

In some embodiments, H(z) meets the following equations:

$$H(z) = \frac{1}{1-z^{-1}} G_1,$$

and $G_1$ is a positive real number.

In some embodiments, D(z) has an equivalent Laplace transfer function D(s) meets the following equations:

$$D(s) = \frac{s+z_1}{(s+p_1)(s+p_2)} G_2,$$

and $G_2$ is a positive real number, $z_1$ is a zero in the Laplace-domain, and $p_1$ and $p_1$ are poles in the Laplace-domain.

Summation node 250 combines digital signal y(z) and a PWM error signal P(z) to become output signal Out(z). PWM error signal P(z) corresponds the quantization error introduced by digital PWM unit 130 and/or other errors attributable to pre-driver units 140A/140B and Class-D output drivers 150A/150B. Output signal Out(z) corresponds to the Z-domain expression of output signals $V_{OUTP}$ and $V_{OUTN}$. Therefore, summation node 250 corresponds to digital PWM unit 130, pre-driver units 140A/140B, or Class-D output drivers 150A/150B.

Feedback block 260 has a gain factor G. Feedback block 260 corresponds to feedback units 160A/160B. In some embodiments, gain factor G corresponds to a ratio of a resistance value of resistive device 166A or 166B to a total resistance value of resistive device 164A and 166A, or 164B and 166B. For example, if resistive device 164A or 164B has a resistance value $R_1$, resistive device 166A or 166B has a resistance value $R_2$, the gain factor G meets the following equation:

$$G = R_2/(R_1+R_2).$$

Therefore, the overall transfer function is:

$$Out(z) = \frac{H(z)D(z)}{1+H(z)D(z)G} In(z) + \frac{H(z)D(z)}{1+H(z)D(z)G} q(z)NTF(z) + \frac{1}{1+H(z)D(z)G} P(z)$$

Figure 3:
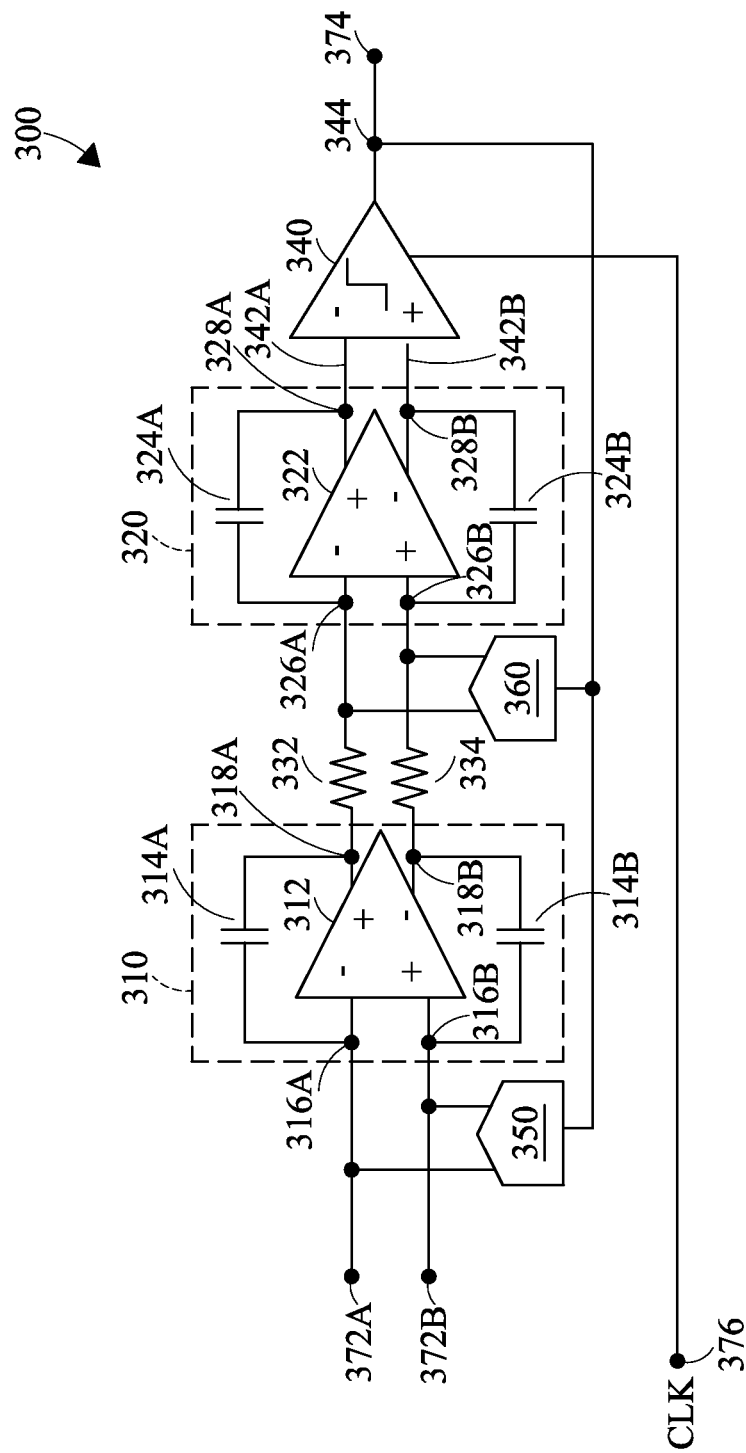
FIG. 3 is a circuit diagram of a continuous-time delta-sigma analog-to-digital converter (ADC) usable in a Class-D amplifier in accordance with some embodiments.

FIG. 3 is a circuit diagram of a continuous-time delta-sigma ADC 300 usable in a Class-D amplifier, such as ADC 110 in Class-D amplifier 100, in accordance with some embodiments. ADC 300 includes a first integration stage 310, a second integration stage 320, coupling resistive devices 332 and 334 connecting integration stages 310 and 320, a quantizer 340 coupled to second integration stage 320, a first digital-to-analog converter DAC 350 coupled to first integration stage 310, and a second DAC 350 coupled to second integration stage 320. Furthermore, ADC 300 includes a first input node 372A, a second input node 372B, an output node 374, and a clock node 376. In some embodiments when ADC 300 is used as ADC 110 in FIG. 1, first input node 372A corresponds to node 112A, second input node 372B corresponds to node 112B, output node 374 corresponds to port 114, and clock node 376 corresponds to node 116.

First integration stage 310 includes an operational amplifier 312, a first capacitive device 314A, and a second capacitive device 314B. Operational amplifier 312 includes an inverted input node 316A, a non-inverted input node 316B, a non-inverted output node 318A, and an inverted output node 318B. First capacitive device 314A is coupled between input node 316A and output node 318A. Second capacitive device 314B is coupled between input node 316B and output node 318B. Input node 316A is coupled to node 372A, and input node 316B is coupled to node 372B.

Second integration stage 320 includes an operational amplifier 322, a third capacitive device 324A, and a fourth capacitive device 324B. Operational amplifier 322 includes an inverted input node 326A, a non-inverted input node 326B, a non-inverted output node 328A, and an inverted output node 328B. Third capacitive device 324A is coupled between input node 326A and output node 328A. Fourth capacitive device 324B is coupled between input node 326B and output node 328B. Input node 326A is coupled to node 316A through coupling resistive device 332, and input node 326B is coupled to node 316B through coupling resistive device 334.

Quantizer 340 includes an inverted input node 342A, a non-inverted input node 342B, and an output node 344. Input node 342A is coupled to output node 328A, and input node 342B is coupled to output node 328B. Output node 344 is coupled to output node 374. Quantizer 340 is a one-bit quantizer. In some embodiments, quantizer 340 includes a comparator. In some embodiments, quantizer 340 is a multiple-bit quantizer.

First DAC 350 is configured to generate a first set of feedback signals at input nodes 316A and 316B of first integration stage 310 based on the digital signal at output node 344. Second DAC 360 is configured to generate a second set of feedback signals at input nodes 326A and 326B of second integration stage 320 based on the digital signal at output node 344. In some embodiments, only one DAC is used to provide feedback signals to integration stages 310 and 320. In some embodiments, more than two DAC and a corresponding logic circuit is used to provide feedback signals to integration stages 310 and 320.

FIG. 4 is a circuit diagram of a digital-to-analog converter (DAC) 400 usable in a continuous-time delta-sigma ADC, such as such as DAC 350 or 360 in ADC 300, in accordance with some embodiments. DAC 400 is a current-steering type DAC and includes a biasing unit 410, a control unit 420, and a current cell 430 coupled to biasing unit 410 and control unit 420. DAC 400 further includes an analog power supply node 442, an analog reference node 444, an input node 452, and output nodes 454 and 456. In some embodiments, analog power supply node 442 corresponds to analog power supply node 192 in FIG. 1 and is configured to have analog supply voltage level AVDD, and analog reference node 444 is configured to have an analog reference ground level. DAC 400 is configured to provide output current signals to the corresponding integration stage, such as integration stage 310 or 310, through output nodes 454 and 456 responsive to a logical value at input node 452.

Biasing unit 410 includes an operation amplifier 412, P-type transistors 413 and 414, a biasing resistive device 415, and an N-type transistor 416. Operation amplifier 412 has an inverted input for receiving a reference voltage level $V_{REF}$, a non-inverted input coupled to node 417, and an output coupled to node 418, which is coupled to a gate of P-type transistor 413. P-type transistor 413 is further coupled between node 442 and node 417, and biasing resistive device 415 is coupled between node 417 and node 444.

P-type transistor 414 is coupled between node 442 and node 419, and a gate of P-type transistor 414 is coupled to node 418. N-type transistor 416 is coupled between node 419 and node 444, and a gate and a drain of N-type transistor 416 are coupled to node 419.

Operation amplifier 412 is configured to set node 417 at a voltage level substantially the same as reference voltage level $V_{REF}$. A reference current level $I_{REF}$ is thus determined by the voltage level at node 417 and a resistance value of biasing resistive device 415. P-type transistor 413 is thus forced to have a source-to-drain current level equals the reference current level $I_{REF}$, and a gate voltage of P-type transistor 413 (node 418) is thus determined according to the reference current level $I_{REF}$. P-type transistor 413 and P-type transistor 414 are configured as a current mirror, and N-type transistor 416 is thus also forced to have a source-to-drain current level equals the reference current level $I_{REF}$, and a gate voltage of N-type transistor 416 (node 419) is thus determined according to the reference current level $I_{REF}$.

Control unit 420 includes a latch 422 and inverters 424 and 426. Latch 422 is coupled to input node 452 and is configured to receive and maintain a logical value from output node of the ADC circuit where the DAC 400 resides, such as the output from node 344. Latch 422 outputs a first pair of differential signals to inverters 424 and 426 and to current cell 430. Inverters 424 and 426 further generate a second pair of differential signals complementary to the first pair of differential signals to current cell 430. The first and second pairs of differential signals constitute a set of control signals for controlling the operation of current cell 430.

Current cell 430 includes a first current source 432, as second current source 434, and a set of switches 435, 436, 437, and 438. First current source 432 includes a P-type transistor having a source coupled to node 442, a gate coupled to node 418, and a drain coupled to switches 435 and 436. First current source 432 and transistor 413 form a current mirror, and first current source 432 is thus set to have a source-to-drain current level determined according to the reference current level IREF. Second current source 434 includes an N-type transistor having a source coupled to node 444, a gate coupled to node 419, and a drain coupled to switches 437 and 438. Second current source 434 and transistor 416 form a current mirror, and second current source 434 is thus set to have a source-to-drain current level determined according to the reference current level IREF.

Switches 435, 436, 437, and 438 are configured to selectively electrically couple first current source 432 or second current source 434 to first output node 454 or second output node 456 according to the set of control signals from control unit 420. As a result, first current source 432 is configured to inject a current to one of output nodes 454 and 456, and second current source 434 is configured to extract a current from the other one of output nodes 454 and 456.

Figure 5:
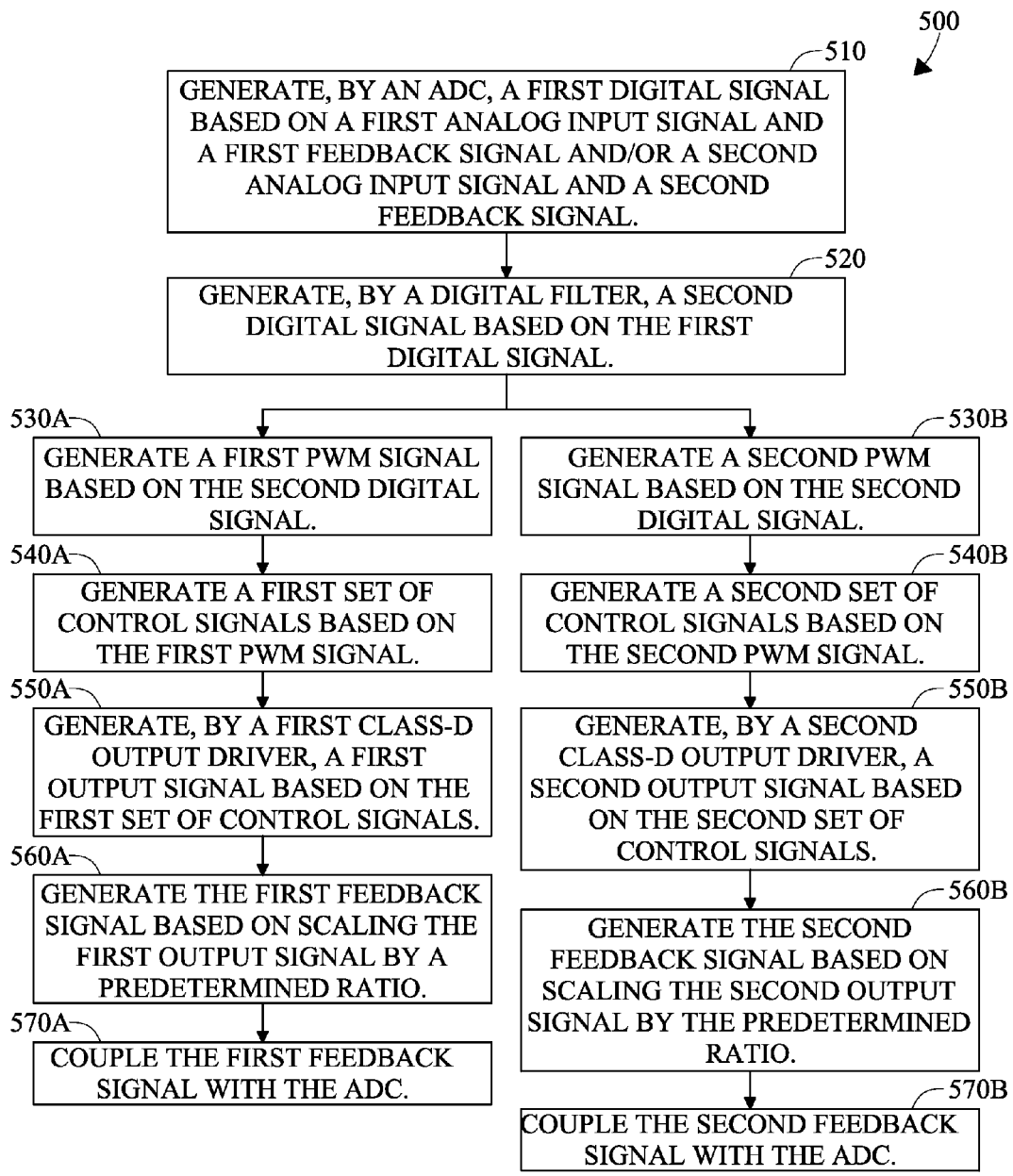
FIG. 5 is a flow chart of a method of operating a Class-D amplifier in accordance with some embodiments.

FIG. 5 is a flow chart of a method 500 of operating a Class-D amplifier, such as Class-D amplifier 100, in accordance with some embodiments. It is understood that additional operations may be performed before, during, and/or after the method 500 depicted in FIG. 5, and that some other processes may only be briefly described herein.

As depicted in FIG. 1 and FIG. 5, the process 500 starts with operation 510, where a first digital signal x(z) is generated by an ADC 110 based on a first analog input signal $V_{INP}$, a first feedback signal $V_{FBN}$, a second analog input signal $V_{INN}$, and a second feedback signal $V_{FBP}$. The process 500 then proceeds to operation 520, where a second digital signal y(z) is generated by a digital filter 120 based on the first digital signal.

In some embodiments when Class-D amplifier 100 has a single-ended-mode configuration, first digital signal x(z) is generated based on first analog input signal $V_{INP}$ and first feedback signal $V_{FBN}$, and second analog input signal $V_{INN}$ and a second feedback signal $V_{FBP}$ are omitted.

The process 500 proceeds to operations 530A and 530B. In operation 530A, a first PWM signal is generated at node 134A based on the second digital signal y(z). In operation 530B, a second PWM signal is generated at node 134B based on the second digital signal y(z). Further, in operation 540A, a first set of control signals is generated by pre-driver unit 140A based on the first PWM signal. In operation 540B, a first set of control signals is generated by pre-driver unit 140B based on the second PWM signal.

The process 500 proceeds to operations 550A and 550B. In operation 550A, a first output signal $V_{OUTN}$ is generated by output driver 150A based on the first set of control signals. In operation 550B, a second output signal $V_{OUTP}$ is generated by output driver 150B based on the second set of control signals.

The process 500 then proceeds to operations 560A and 560B. In operation 560A, the first feedback signal $V_{FBN}$ is generated based on scaling the first output signal $V_{OUTN}$ by a predetermined ratio. In operation 560B, the second feedback signal $V_{FBP}$ is generated based on scaling the second output signal $V_{OUTP}$ by the predetermined ratio. In some embodiments, the predetermined ratio is determined by resistance values of resistive networks of feedback units 160A or 160B. Furthermore, in operation 570A, the first feedback signal $V_{FBN}$ is coupled with ADC 110. In operation 570B, the second feedback signal $V_{FBP}$ is coupled with ADC 110. Operations 560A, 560B, 570A, and 570B are performed without performing a low-pass filtering operation that has a cutoff frequency lower than a sampling frequency of the ADC 110.

In some embodiments when Class-D amplifier 100 has a single-ended-mode configuration, operations 530B, 540B, 550B, 560B, and 570B are omitted.

In accordance with one embodiment, a Class-D amplifier includes an analog-to-digital converter (ADC), a digital filter, a digital pulse width modulation (PWM) unit, a first pre-driver unit, a first output driver, and a first feedback unit. The ADC has a first input node and is configured to receive a first analog input signal and a first feedback signal at the first input node of the ADC, and to generate a first digital signal based on the first analog input signal and the first feedback signal. The digital filter is configured to generate a second digital signal based on the first digital signal. The PWM unit is configured to generate a first PWM signal based on the second digital signal. The first pre-driver unit is configured to generate a first set of control signals based on the first PWM signal. The first output driver has an output node, and the first output driver is configured to generate a first output signal at the output node of the first output driver based on the first set of control signals. The first feedback unit is configured to generate the first feedback signal based on the first output signal. A first feedback path is defined as from the output node of the first output driver through the first feedback unit to the first input node of the ADC, and the first feedback path is free from a low-pass filtering device that has a cutoff frequency lower than a sampling frequency of the ADC.

In accordance with another embodiment, a circuit includes an analog-to-digital converter (ADC), a digital filter, a digital pulse width modulation (PWM) unit, a first pre-driver unit, a first Class-D output driver, a first resistive network, a second pre-driver unit, a second Class-D output driver, and a second resistive network. The ADC has a non-inverted input node, an inverted input node, and an N-bit digital output port, and N is a positive integer. The digital filter has an input port and an output port, and the input port of the digital filter is coupled to the output port of the ADC. The digital PWM unit has an input port, a first PWM output node, and a second PWM output node. The input port of the digital PWM unit is coupled to the output port of the digital filter. The first pre-driver unit includes an input node, a first output node, and a second output node. The input node of the first pre-driver unit is coupled to the first PWM output node. The first Class-D output driver has a first input node, a second input node, and an output node. The first input node of the first Class-D output driver is coupled to the first output node of the first pre-driver unit, and the second input node of the first Class-D output driver is coupled to the second output node of the first pre-driver unit. The first resistive network has a first node and a second node, where the first node of the first resistive network is coupled to the output node of the first Class-D output driver, and the second node of the first resistive network is coupled to the non-inverted input node of the ADC. A first feedback path is defined as from the output node of the first Class-D output driver through the first resistive network to the non-inverted input node of the ADC, and the first feedback path is free from a low-pass filtering device that has a cutoff frequency lower than a sampling frequency of the ADC. The second pre-driver unit includes an input node, a first output node, and a second output node. The input node of the second pre-driver unit is coupled to the second PWM output node. The second Class-D output driver has a first input node, a second input node, and an output node. The first input node of the second Class-D output driver is coupled to the first output node of the second pre-driver unit, and the second input node of the second Class-D output driver is coupled to the second output node of the second pre-driver unit. The second resistive network has a first node and a second node, where the first node of the second resistive network is coupled to the output node of the second Class-D output driver, and a second node of the second resistive network is coupled to the inverted input node of the ADC. A second feedback path is defined as from the output node of the second Class-D output driver through the second resistive network to the inverted input node of the ADC, and the second feedback path is free from a low-pass filtering device that has a cutoff frequency lower than the sampling frequency of the ADC.

In accordance with another embodiment, a method includes generating, by an analog-to-digital converter (ADC), a first digital signal based on a first analog input signal and a first feedback signal and generating, by a digital filter, a second digital signal based on the first digital signal. A first PWM signal is generated based on the second digital signal. A first set of control signals is generated based on the first PWM signal. A first output signal is generated, by a first Class-D output driver, based on the first set of control signals. The first feedback signal is generated, by a first Class-D output driver, based on scaling the first output signal by a predetermined ratio. The first feedback signal is coupled with the ADC. The generating the first feedback signal and the coupling the first feedback signal are performed without performing a low-pass filtering operation that has a cutoff frequency lower than a sampling frequency of the ADC.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A Class-D amplifier, comprising:
an analog-to-digital converter (ADC) having a first input node, the ADC being configured to:
receive a first analog input signal and a first feedback signal at the first input node of the ADC, and
generate a first digital signal based on the first analog input signal and the first feedback signal;
a digital filter configured to generate a second digital signal based on the first digital signal;
a digital pulse width modulation (PWM) unit configured to generate a first PWM signal based on the second digital signal;
a first pre-driver unit configured to generate a first set of control signals based on the first PWM signal;
a first output driver having an output node, the first output driver being configured to generate a first output signal at the output node of the first output driver based on the first set of control signals; and
a first feedback unit configured to generate the first feedback signal based on the first output signal, a first feedback path being defined as from the output node of the first output driver through the first feedback unit to the first input node of the ADC, and the first feedback path being free from a low-pass filtering device that has a cutoff frequency lower than a sampling frequency of the ADC.

2. The Class-D amplifier of claim 1, wherein the ADC, the digital filter, the first pre-driver unit, and the first feedback unit are configured in a manner that the first feedback path functions as a negative feedback path with respect to the first analog input signal.

3. The Class-D amplifier of claim 1, wherein the first feedback unit comprises a resistive network configured as a voltage divider.

4. The Class-D amplifier of claim 1, wherein the ADC is a continuous-time ADC.

5. The Class-D amplifier of claim 1, wherein
the first analog input signal has a signal bandwidth ranging from a zero frequency to a predetermined frequency; and
the sampling frequency of the ADC is not less than a predetermined multiple of the predetermined frequency, the predetermined multiple being at least 2.

6. The Class-D amplifier of claim 5, wherein the predetermined multiple is 64, 128, or 256.

7. The Class-D amplifier of claim 1, wherein the digital filter comprises a loop filter followed by a compensation filter.

8. The Class-D amplifier of claim 1, wherein
the ADC further comprises a second input node, and the ADC is further configured to:
receive a second analog input signal and a second feedback signal at the second input node of the ADC, and
generate the first digital signal based on the first analog input signal, the first feedback signal, the second analog input signal, and the second feedback signal;
the digital PWM unit is further configured to generate a second PWM signal based on the second digital signal; and
the Class-D amplifier further comprises:
a second pre-driver unit configured to generate a second set of control signals based on the second PWM signal;
a second output driver having an output node, the second output driver being configured to generate a second output signal at the output node of the second output driver based on the second set of control signals; and a second feedback unit configured to generate the second feedback signal based on the second output signal, a second feedback path being defined as from the output node of the second output driver through the second feedback unit to the second input node of the ADC, and the second feedback path being free from a low-pass filtering device that has a cutoff frequency lower than the sampling frequency of the ADC.

9. The Class-D amplifier of claim 8, wherein the ADC, the digital filter, the second pre-driver unit, and the second feedback unit are configured in a manner that the second feedback path functions as a negative feedback path with respect to the second analog input signal.

10. The Class-D amplifier of claim 8, wherein the second feedback unit comprises a resistive network configured as a voltage divider.

11. The Class-D amplifier of claim 8, wherein the ADC is a delta-sigma continuous-time ADC.

12. The Class-D amplifier of claim 11, wherein the ADC comprises:
a first integration stage comprising input nodes and output nodes, the input nodes of the first integration stage being coupled with the first input node and the second input node of the ADC;
a second integration stage comprising input nodes and output nodes, the input nodes of the second integration stage being coupled with the output nodes of the first integration stage;
a quantizer comprising input nodes and one or more output nodes, the input nodes of the quantizer being coupled with the output nodes of the second integration stage, and the one or more output nodes being configured to carry the first digital signal; and
one or more digital-to-analog converters (DACs) configured to generate feedback signals at input nodes of the first integration stage and the input nodes of the second integration stage based on the first digital signal.

13. The Class-D amplifier of claim 12, wherein the one or more DACs comprise a current-steering type DAC, and the current-steering type DAC comprises:
a first output node;
a second output node;
a control unit configured to generate a third set of control signals based on the first digital signal; and
a current cell comprising:
a first current source configured to inject a first current to the first output node of the current-steering type DAC or the second output node of the current-steering type DAC;
a second current source configured to extract a second current from the first output node of the current-steering type DAC or the second output node of the current-steering type DAC; and
a set of switches configured to selectively electrically couple the first current source or the second current source with the first output node of the current-steering type DAC or the second output node of the current-steering type DAC according to the third set of control signals.

14. A circuit, comprising:
an analog-to-digital converter (ADC) having a non-inverted input node, an inverted input node, and an N-bit digital output port, N being a positive integer;
a digital filter having an input port and an output port, the input port of the digital filter being coupled to the output port of the ADC;
a digital pulse width modulation (PWM) unit having an input port, a first PWM output node, and a second PWM output node, the input port of the digital PWM unit being coupled to the output port of the digital filter;
a first pre-driver unit comprising an input node, a first output node, and a second output node, the input node of the first pre-driver unit being coupled to the first PWM output node;
a first Class-D output driver having a first input node, a second input node, and an output node, the first input node of the first Class-D output driver being coupled to the first output node of the first pre-driver unit, the second input node of the first Class-D output driver being coupled to the second output node of the first pre-driver unit;
a first resistive network having a first node and a second node, the first node of the first resistive network coupled to the output node of the first Class-D output driver, and the second node of the first resistive network coupled to the non-inverted input node of the ADC, a first feedback path being defined as from the output node of the first Class-D output driver through the first resistive network to the non-inverted input node of the ADC, and the first feedback path being free from a low-pass filtering device that has a cutoff frequency lower than a sampling frequency of the ADC;
a second pre-driver unit comprising an input node, a first output node, and a second output node, the input node of the second pre-driver unit being coupled to the second PWM output node;
a second Class-D output driver having a first input node, a second input node, and an output node, the first input node of the second Class-D output driver being coupled to the first output node of the second pre-driver unit, the second input node of the second Class-D output driver being coupled to the second output node of the second pre-driver unit; and
a second resistive network having a first node and a second node, the first node of the second resistive network coupled to the output node of the second Class-D output driver, and the second node of the second resistive network coupled to the inverted input node of the ADC, a second feedback path being defined as from the output node of the second Class-D output driver through the second resistive network to the inverted input node of the ADC, and the second feedback path being free from a low-pass filtering device that has a cutoff frequency lower than the sampling frequency of the ADC.

15. The circuit of claim 14, wherein the ADC is a delta-sigma continuous-time ADC.

16. The circuit of claim 14, further comprising:
a first power supply node having a first supply voltage level;
a first reference node having a first ground reference level;
a second power supply node having a second supply voltage level, the second supply voltage level being greater than the first supply voltage level; and
a second reference node having a second ground reference level, the second ground reference level being substantially the same as the first ground reference level,
wherein
the digital filter and the digital PWM unit are electrically coupled between the first power supply node and the first reference node; and the first Class-D output driver and the second Class-D output driver are electrically coupled between the second power supply node and the second reference node.

17. The circuit of claim 14, wherein
the ADC is configured to receive a pair of differential analog signals through the non-inverted input node and the inverted input node;
the pair of differential analog signals have a signal bandwidth ranging from a zero frequency to a predetermined frequency; and
the ADC is further configured to receive a clock signal having the sampling frequency, the sampling frequency being no less than a predetermined multiple of the predetermined frequency, and the predetermined multiple being at least 2.

18. The circuit of claim 17, wherein the predetermined multiple is 64, 128, or 256.

19. A method, comprising:
generating, by an analog-to-digital converter (ADC), a first digital signal based on a first analog input signal and a first feedback signal;
generating, by a digital filter, a second digital signal based on the first digital signal;
generating a first PWM signal based on the second digital signal;
generating a first set of control signals based on the first PWM signal;
generating, by a first Class-D output driver, a first output signal based on the first set of control signals;
generating the first feedback signal based on scaling the first output signal by a predetermined ratio; and
coupling the first feedback signal with the ADC,
the generating the first feedback signal and the coupling the first feedback signal being performed without performing a low-pass filtering operation that has a cutoff frequency lower than a sampling frequency of the ADC.

20. The method of claim 19, wherein
the generating the first digital signal is performed further based on a second analog input signal and a second feedback signal; and
the method further comprises:
generating a second PWM signal based on the second digital signal;
generating a second set of control signals based on the second PWM signal;
generating, by a second Class-D output driver, a second output signal based on the second set of control signals;
generating the second feedback signal based on scaling the second output signal by the predetermined ratio; and
coupling the second feedback signal with the ADC,
the generating the second feedback signal and the coupling the second feedback signal being performed without performing a low-pass filtering operation that has a cutoff frequency lower than the sampling frequency of the ADC.

* * * * *